(12) United States Patent
Ishizeki et al.

(10) Patent No.: US 11,697,739 B2
(45) Date of Patent: Jul. 11, 2023

(54) FLUORINATED ETHER COMPOSITION FOR VAPOR DEPOSITION, AND ARTICLE WITH VAPOR-DEPOSITED FILM AND METHOD FOR ITS PRODUCTION

(71) Applicant: AGC Inc., Chiyoda-ku (JP)

(72) Inventors: Kenji Ishizeki, Chiyoda-ku (JP); Hideyuki Hirakoso, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 578 days.

(21) Appl. No.: 16/697,306

(22) Filed: Nov. 27, 2019

(65) Prior Publication Data

US 2020/0095428 A1    Mar. 26, 2020

Related U.S. Application Data

(63) Continuation of application No. PCT/JP2018/020580, filed on May 29, 2018.

(30) Foreign Application Priority Data

Jun. 2, 2017    (JP) .................. 2017-110141

(51) Int. Cl.
   *C09D 171/00*    (2006.01)
   *B32B 27/28*    (2006.01)
   *C09D 4/06*    (2006.01)
   *C23C 14/12*    (2006.01)
   *C09D 5/16*    (2006.01)

(52) U.S. Cl.
   CPC .............. *C09D 4/06* (2013.01); *C23C 14/12* (2013.01)

(58) Field of Classification Search
   None
   See application file for complete search history.

(56) References Cited

U.S. PATENT DOCUMENTS

2016/0137878 A1* 5/2016 Yamane ............... C09D 171/00
528/36

FOREIGN PATENT DOCUMENTS

| JP | 2014080473 A | * | 5/2014 | ............... C09K 3/00 |
| JP | 2015214664 A | * | 12/2015 | |

OTHER PUBLICATIONS

Machine translation of JP-2014080473-A (no date).*
International Search report dated Aug. 7, 2018 in PCT/JP2018/020580 filed May 29, 2018.

* cited by examiner

*Primary Examiner* — Michael J Feely
(74) *Attorney, Agent, or Firm* — Oblon, McClelland, Maier & Neustadt, L.L.P.

(57) ABSTRACT

To provide a fluorinated ether composition for vapor deposition which can be used to form a vapor-deposited film excellent in frictional durability, and an article with a vapor-deposited film and a method for its production. This fluorinated ether composition for vapor deposition comprises a compound (A) having a poly(oxyperfluoroalkylene) chain and a hydrolyzable silyl group, and a partial condensate (B) of the compound (A), wherein the proportion of the partial condensate (B) to the total amount of the compound (A) and the partial condensate (B) is from 4 to 40 mass %.

10 Claims, 1 Drawing Sheet

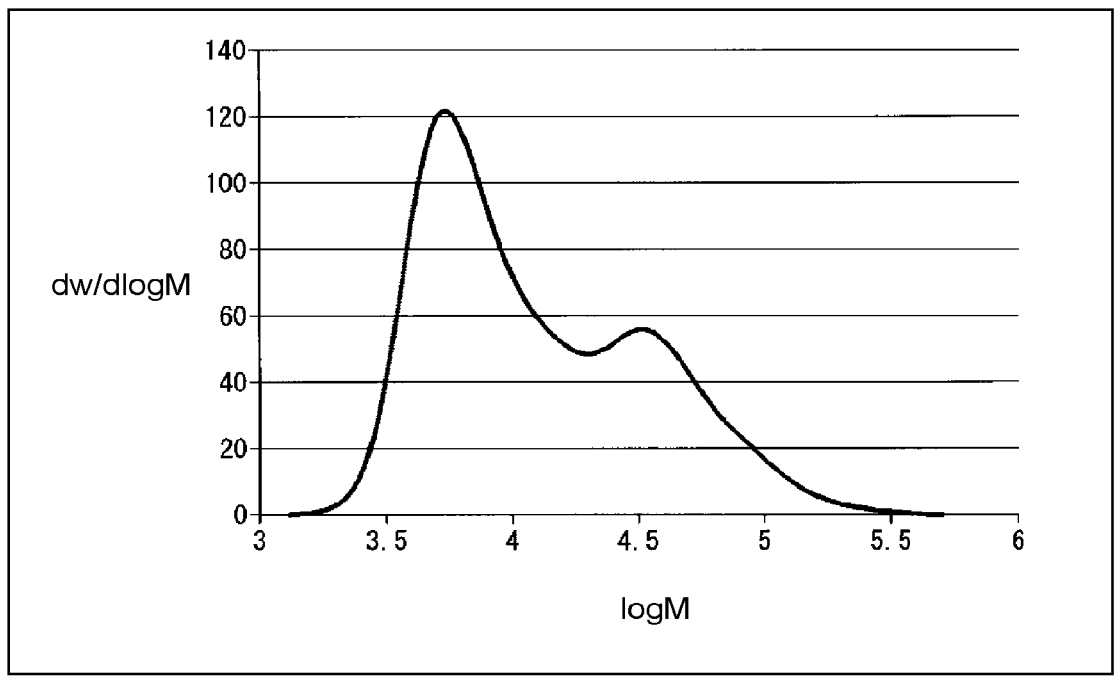

FLUORINATED ETHER COMPOSITION FOR VAPOR DEPOSITION, AND ARTICLE WITH VAPOR-DEPOSITED FILM AND METHOD FOR ITS PRODUCTION

TECHNICAL FIELD

The present invention relates to a fluorinated ether composition for vapor deposition, and an article with vapor-deposited film and a method for its production.

BACKGROUND ART

A fluorinated compound shows high lubricity, water/oil repellency, etc. and thus is used for a surface treatment agent, etc. For example, when it is applied to the surface of a substrate as a surface treatment agent, to form a surface layer, lubricity, water/oil repellency, etc. will be imparted, and it becomes easy to wipe off dirt from the surface of the substrate, whereby removability of the dirt will be improved. Among fluorinated compounds, a fluorinated ether compound having a poly(oxyperfluoroalkylene) chain wherein ether bonds (—O—) are present in perfluoroalkyl chains, is excellent in removability of dirt such as fats and oils.

Such a fluorinated ether compound has a performance (fingerprint stain removability) whereby fingerprints attached on a surface can be easily removed by wiping, and therefore, has been used as a surface treatment agent for, for example, a member constituting a surface of a touch panel to be touched by a finger.

In order to provide a layer of a fluorinated ether compound on the surface of a substrate such as glass or metal, a compound having a hydrolyzable silyl group introduced at a terminal of a fluorinated ether compound has been proposed. The surface layer formed from such a fluorinated ether compound having a hydrolyzable silyl group may be bonded to the surface of e.g. glass or metal by a silanol group formed by decomposition of the hydrolyzable silyl group.

With the fluorinated ether compound having a hydrolyzable silyl group, there may be a case where a part thereof may undergo multimerization by e.g. an influence of water contained in the liquid medium. Heretofore, it has been considered that the multimer is undesirable from the viewpoint of e.g. storage stability of the coating liquid, and, for example, in Patent Document 1, a method for preventing multimerization by lowering the water content in the liquid medium, is described.

PRIOR ART DOCUMENT

Patent Document

Patent Document 1: JP-A-2015-214664

DISCLOSURE OF INVENTION

Technical Problem

As a method of forming the surface layer, there are a wet coating method and a dry coating method. Unlike the wet coating method as described in Patent Document 1, a dry coating method which does not require a large amount of a liquid medium, is preferred from the viewpoint of e.g. the working environment and has attracted attention.

In recent years, demand for friction durability has become increasingly stringent, and also in the case of a vacuum vapor deposition method as an example of the dry coating method, further improvement of friction durability has been demanded.

The present invention has an object to provide a fluorinated ether composition for vapor deposition, which is capable of forming a vapor-deposited film excellent in friction durability, as well as an article with vapor-deposited film excellent in friction durability and a method for its production.

Solution to Problem

The present invention provides a fluorinated ether composition for vapor deposition, as well as an article with vapor-deposited film and a method for its production, having the following constructions [1] to [10].

[1] A fluorinated ether composition comprising a compound (A) having a poly(oxyperfluoroalkylene) chain and b groups (where b is an integer of 1 or more) each represented by the following formula (I), and a partial condensate (B) of the compound (A), characterized in that the proportion of the partial condensate (B) to the total amount of the compound (A) and the partial condensate (B) is from 4 to 40 mass %, $$—SiR_nL_{3-n} \qquad (I)$$

where L is a hydroxy group or a hydrolyzable group,
R is a hydrogen atom or a monovalent hydrocarbon group,
when b is an integer of at least 2, n is an integer of from 0 to 2, and when b is 1, n is 0 or 1,
when n is 0 or 1, (3-n) L may be the same or different,
when n is 2, n R may be the same or different.

[2] The composition according to [1], wherein the number average molecular weight of the compound (A) is from 2,000 to 10,000.
[3] The composition according to [1] or [2], wherein the number average molecular weight of the partial condensate (B) is from 4,000 to 30,000.
[4] The composition according to any one of [1] to [3], wherein the partial condensate (B) is a partially hydrolyzed condensate of the compound (A) wherein L is a hydrolyzable group.
[5] The composition according to any one of [1] to [4], wherein the compound (A) is a compound represented by the following formula (A1), $$[R^{f1}—O-Q-R^{f\alpha}-]_aZ^1[—SiR_nL_{3-n}]_b \qquad (A1)$$

where L, R, n and b have the same meanings as defined above,
$R^{f1}$ is a perfluoroalkyl group,
Q is a single bond, an oxyfluoroalkylene group containing at least one hydrogen atom, or a polyoxyfluoroalkylene group having from 2 to 5 such oxyfluoroalkylene groups combined, wherein the oxyfluoroalkylene groups constituting such a group may be the same or different,
$R^{f\alpha}$ is said poly(oxyperfluoroalkylene) chain,
$Z^1$ is an (a+b)-valent linking group,
a is an integer of at least 1,
when a is at least 2, a [$R^{f1}$—O-Q-$R^{f\alpha}$-] may be the same or different,
when b is at least 2, b [—$SiR_nL_{3-n}$] may be the same or different.
[6] The composition according to any one of [1] to [5], wherein b is 2 or 3.
[7] A coating liquid characterized by comprising the composition as defined in any one of [1] to [6] and a liquid medium.

[8] An article with vapor-deposited film, characterized by having a vapor-deposited film formed from the composition as defined in any one of [1] to [6].
[9] A method for producing an article with vapor-deposited film, characterized by vapor-depositing the composition as defined in any one of [1] to [6] on a substrate.
[10] The production method according to [9], wherein the vapor deposition is carried out under such conditions that the temperature is from 20 to 300° C. and the pressure is at most $1 \times 10^{-1}$ Pa.

Advantageous Effects of Invention

According to the fluorinated ether composition for vapor deposition of the present invention, it is possible to form a vapor-deposited film which is excellent in friction durability. Further, according to the article with vapor-deposited film and the method for its production of the present invention, it is possible to provide an article having a vapor-deposited film excellent in friction durability.

BRIEF DESCRIPTION OF THE DRAWING

FIG. 1 is a chromatogram by gel permeation chromatography obtained in Ex. 1 in working Examples.

DESCRIPTION OF EMBODIMENTS

In the present specification, a compound represented by the formula (A1) will be referred to as a compound (A1). Compounds represented by other formulae will be referred to in the same manner. Also, a group represented by the formula (I) will be referred to as a group (I). Groups represented by other formulae will be referred to in the same manner.
In this specification, meanings of the following terms are as follows.
A "hydrolyzable silyl group" means a group capable of forming a silanol group (Si—OH) by undergoing a hydrolysis reaction.
The chemical formula of an oxyperfluoroalkylene group will be presented by putting its oxygen atom at the right side of the perfluoroalkylene group.
An "etheric oxygen atom" means an oxygen atom forming an ether bond (—O—) between carbon-carbon atoms.
[Fluorinated Ether Composition]
The fluorinated ether composition of the present invention (hereinafter referred to also as the present composition) comprises a compound (A) and its partial condensate (B)
A compound (A) wherein L is a hydroxy group is considered to be condensed by a dehydration reaction of some of its hydroxy groups to become the partial condensate (B). A compound (A) wherein L is a hydrolyzable group is considered to be condensed by a dehydration reaction of hydroxy groups formed by hydrolysis of some of its hydrolyzable groups, to become the partial condensate (B).
(Compound (A))
The compound (A) has a poly(oxyperfluoroalkylene) chain (hereinafter a poly(oxyperfluoroalkylene) chain in the compound (A) will be referred to also as a chain α) and n groups (I) (where b is an integer of 1 or more).

$$-SiR_nL_{3-n} \qquad (I)$$

where L is a hydroxy group or a hydrolyzable group,
R is a hydrogen atom or a monovalent hydrocarbon group,
when b is an integer of at least 2, n is an integer of from 0 to 2, and when b is 1, n is 0 or 1,
when n is 0 or 1, (3-n) L may be the same or different, and when n is 2, n R may be the same or different.

The number of chains a which the compound (A) has, may be 1, or may be 2 or more. From the viewpoint of excellent friction durability and lubricity, it is preferably 1 to 3.

In a case where the compound (A) has two or more chains a, the respective chains a may be the same or different.

The number b of groups (I) which the compound (A) has, may be 1 or may be 2 or more. When b is 1, n is 0 or 1. Thus, the compound (A) may have at least 2 groups represented by the above L (groups L) per molecule.

The number b of groups (I) which the compound (A) has, is preferably 1 to 6, more preferably 1 to 4, particularly preferably 2 to 3, since a film (hereinafter referred to also as a vapor-deposited film) to be formed on the surface of a substrate by a vacuum vapor deposition method will thereby be more excellent in friction durability.

In a case where the compound (A) has 2 or more groups (I), the respective groups (I) may be the same or different. From the viewpoint of the production efficiency of the compound (A), it is preferred that all are the same groups.

It is preferred that at one terminal of the chain α, a group (II) is bonded. That is, the compound (A) preferably further has a group (II) bonded to one terminal of the chain α. This makes the vapor-deposited film excellent in lubricity.

$$R^{f1}\text{—O-Q-} \qquad (II)$$

where $R^{f1}$ is a perfluoroalkyl group, and Q is a single bond, a $C_{2\text{-}10}$ oxyfluoroalkylene group containing at least one hydrogen atom, or a polyoxyfluoroalkylene group having 2 to 5 such oxyfluoroalkylene groups combined. Oxyfluoroalkylene groups constituting the polyoxyfluoroalkylene group may all be the same or different.

The number average molecular weight (Mn) of the compound (A) is preferably from 2,000 to 10,000, more preferably from 2,500 to 8,000, particularly preferably from 3,000 to 6,000. When the number average molecular weight of the compound (A) is at least the lower limit value in the above range, the lubricity of the vapor-deposited film will be excellent. When the number average molecular weight of the compound (A) is at most the upper limit value in the above range, the friction durability of the vapor-deposited film will be more excellent.

The number average molecular weight (Mn) is measured by the measuring method as described in Examples given below.

Poly(oxyperfluoroalkylene) Chain

The chain α may be one represented by the following formula (α1).

$$(R^{f2}O)_{m1} \qquad (\alpha 1)$$

where $R^{f2}$ is a perfluoroalkylene group,
m1 is an integer of from 2 to 200, and
$(R^{f2}O)_{m1}$ may be one composed of two or more types of $R^{f2}O$ different in the number of carbon atoms.

$R^{f2}$ may be a linear structure or a branched structure, but from such a viewpoint that lubricity of the vapor-deposited film will be further excellent, a linear structure is preferred.

The number of carbon atoms in $R^{f2}$ is preferably from 1 to 6; from such a viewpoint that friction durability and lubricity of the vapor-deposited film will be more excellent, is more preferably from 2 to 6, further preferably from 2 to 4; and from such a viewpoint that the lubricity of the vapor-deposited film will be further excellent, is particularly preferably 2.

m1 is preferably an integer of from 5 to 150, particularly preferably an integer of from 1 to 100. When m1 is at least the lower limit value in the above range, lubricity of the vapor-deposited film will be excellent. When m1 is at most the upper limit value in the above range, friction durability of the vapor-deposited film will be excellent. That is, if the number average molecular weight of the compound (A) is too large, the number of groups (I) present per unit molecular weight decreases, whereby the frictional resistance lowers.

In a case where the chain α is composed of 2 or more types of $R^{f2}O$ different in the number of carbon atoms, the bonding order is not particularly limited. The respective oxyperfluoroalkylene groups may be arranged at random, alternating or in blocks.

As specific modes of the chain (α1), the following (α1-1) to (α1-8) may be mentioned. In the following formulae, { } indicates that m11 pieces and m12 pieces of the respective two types of oxyperfluoroalkylene groups are randomly arranged therein.

$(CF_2O)_{m01}$ (α1-1)

$\{(CF_2O)_{m11}(CF_2CF_2O)_{m12}\}$ (α1-2)

$\{(CF_2O)_{m11}(CF_2CF_2CF_2O)_{m12}\}$ (α1-3)

$\{(CF_2O)_{m11}(CF_2CF_2CF_2CF_2O)_{m12}\}$ (α1-4)

$\{(CF_2O)_{m11}(CF(CF_3)CF_2O)_{m12}\}$ (α1-5)

$(CF_2CF_2O)_{m13}$ (α1-6)

$(CF_2CF_2CF_2O)_{m14}$ (α1-7)

$(CF_2CF_2O—CF_2CF_2CF_2CF_2O)_{m15}$ (α1-8)

Here, m01 is an integer of from 2 to 200, m11 is an integer of at least 1, m12 is an integer of at least 1, (m11+m12) is an integer of from 2 to 200.

Each of m01 and (m11+m12) is an integer of from 2 to 200, preferably an integer of from 5 to 150, particularly preferably an integer of from 10 to 80.

The ratio (m11/m12) of m11 to m12 is preferably from 99/1 to 30/70, particularly preferably from 90/10 to 40/60.

Further, each of m13 and m14 is an integer of from 2 to 200. m15 is an integer of from 1 to 100, preferably an integer of from 3 to 75, particularly preferably an integer of from 5 to 40.

Among the above, (α1-2) to (α1-4) and (α1-8) are preferred, and (α1-2) and (α1-8) are particularly preferred.

Further, in the above (α1-2) to (α1-5) and (α1-8), it is also preferred that from 1 to 4 ($R^{f2}O$) are attached to the front or rear of the respective formulae. In such a case, the total number of m11 and m12 shall be at most 200 by adding the number of such ($R^{f2}O$), and m15 shall be at most 200 by adding the number of such ($R^{f2}O$).

As specific modes of the chain (α1) having the above ($R^{f2}O$), the following groups may, for example, be mentioned.

$(CF_2CF_2O)_2\{(CF_2O)_{m11}(CF_2CF_2O)_{m12}\}$ $(CF_2CF_2O—CF_2CF_2CF_2CF_2O)_{m15}(CF_2CF_2O)$

In the present composition, the compound (A) may be a single compound composed of one compound (A), or may be a mixture of two or more compounds (A).

In this specification, fluorinated ether compounds in the same group of compounds other than having a distribution in the number of repetition number of an oxyperfluoroalkylene group in poly(oxyperfluoroalkylene) chains shall be deemed to be a single compound.

For example, in the case of compounds (A) wherein the chain α is $\{(CF_2O)_{m11}(CF_2CF_2O)_{m12}\}$, the same group of compounds other than having a distribution in m11 and m12 shall be deemed to be a fluorinated ether compound being a single compound.

Group (I)

In the group (I), L is a hydroxy group or a hydrolyzable group.

The hydrolyzable group is a group which becomes to be a hydroxy group by a hydrolysis reaction. That is, in a case where L is a hydrolyzable group, Si-L in the group (I) becomes to be a silanol group (Si—OH) by a hydrolysis reaction.

As the hydrolyzable group, an alkoxy group, a halogen atom, an acyl group, an isocyanate group (—NCO), etc. may be mentioned. The number of carbon atoms in the alkoxy is preferably from 1 to 4. As the halogen atom, a chlorine atom is particularly preferred.

L is preferably a hydrolyzable group from the viewpoint of e.g. the storage stability of the compound (A) itself, the storage stability of the compound (B) itself, and efficiency in adjustment of the reaction for producing the compound (B) from the compound (A) (e.g. adjustment of the proportion for converting the compound (A) to the compound (B), the condensation degree of the compound (B), etc.).

Further, from the viewpoint of efficiency in the production of the compound (A), L is preferably a $C_{1-4}$ alkoxy group or a halogen atom. From the viewpoint of less outgassing during vapor deposition, and excellent storage stability of the compound (A), a $C_{1-4}$ alkoxy group is preferred; in a case where the long-term storage of the compound (A) is required, an ethoxy group is particularly preferred; and in the case of shorting the reaction time after vapor deposition, a methoxy group is particularly preferred.

R is a hydrogen atom or a monovalent hydrocarbon group.

As the monovalent hydrocarbon group, a saturated hydrocarbon group such as an alkyl group or a cycloalkyl group, an alkenyl group, an aryl group, etc. may be mentioned, and a saturated hydrocarbon group is preferred.

The number of carbon atoms in the monovalent saturated hydrocarbon group is preferably from 1 to 6, more preferably from 1 to 3, particularly preferably 1 or 2, since it is thereby easy to produce the compound (A).

n is preferably 0 or 1, particularly preferably 0. By the presence of a plurality of L in one group (I), adhesion to the substrate becomes stronger, whereby the friction durability of the vapor-deposited film will be more excellent.

When n is 0 or 1, (3−n) pieces of L may be the same or different. For example, some of L may be a hydrolyzable group, and the rest of L may be a hydroxy group.

As the group (I), $Si(OCH_3)_3$, $SiCH_3(OCH_3)_2$, $Si(OCH_2CH_3)_3$, $SiCl_3$, $Si(OCOCH_3)_3$ or $Si(NCO)_3$ is preferred. From the viewpoint of handling efficiency in the industrial production, $Si(OCH_3)_3$ is particularly preferred.

Group (II)

In the group (II), $R^{f1}$ is a perfluoroalkyl group.

In $R^{f1}$, the number of carbon atoms in the perfluoroalkyl group is preferably from 1 to 20, more preferably from 1 to 10, further preferably from 1 to 6, particularly preferably from 1 to 3, from such a viewpoint that lubricity and friction durability of the vapor-deposited film will be more excellent.

The perfluoroalkyl group may be linear or branched, preferably linear. As the linear perfluoroalkyl group, for example, $CF_3$—, $CF_3CF_2$—, $CF_3CF_2CF_2$— or the like may be mentioned.

Q is a single bond, a $C_{2-10}$ oxyfluoroalkylene group containing at least one hydrogen atom, or a polyoxyfluoroalkylene group having from 2 to 5 (preferably from 2 to 4) such oxyfluoroalkylene groups combined. In the polyoxyfluoroalkylene group, the plurality of oxyfluoroalkylene groups are usually bonded in series.

When Q is the oxyfluoroalkylene group containing a hydrogen atom, or the polyoxyfluoroalkylene group having from 2 to 5 such oxyfluoroalkylene groups combined, solubility of the compound (A) in the liquid medium will be high.

The number of carbon atoms in the oxyfluoroalkylene group is preferably from 2 to 6, more preferably from 2 to 4, particularly preferably 2 or 3.

The number of hydrogen atoms in the oxyfluoroalkylene group is at least 1, preferably at least 2, particularly preferably at least 3, from such a viewpoint that appearance of the vapor-deposited film will be excellent. The number of hydrogen atoms in the oxyfluoroalkylene group is preferably at most (the number of carbon atoms in Q)×2, particularly preferably at most (the number of carbon atoms in Q) from such a viewpoint that the water/oil repellency of the vapor-deposited film will be further excellent.

The oxyfluoroalkylene group may be linear or branched, but is preferably linear from such a viewpoint that the lubricity of the vapor-deposited film will be further excellent.

In the polyoxyfluoroalkylene group, from 2 to 5 oxyfluoroalkylene groups may all be the same or different.

From the viewpoint of efficiency in the production of the compound (A), Q is preferably a single bond, or a group (provided that the left side is bonded to $R^{f1}$—O) selected from the group consisting of —$CHFCF_2OCH_2CF_2O$—, —$CF_2CHFCF_2OCH_2CF_2O$—, —$CF_2CF_2CHFCF_2OCH_2CF_2O$—, —$CF_2CF_2OCHFCF_2OCH_2CF_2O$—, —$CF_2CF_2OCF_2CF_2OCHFCF_2OCH_2CF_2O$—, —$CF_2CH_2OCH_2CF_2O$— and —$CF_2CF_2OCF_2CH_2OCH_2CF_2O$—.

The compound (A) is not particularly limited so long as it has a chain α and group(s) (I). For example, it may be suitably selected from known fluorinated ether compounds as described in the following documents.

JP-A-2013-91047, JP-A-2014-80473, WO2013/042732, WO2013/042733, WO2013/121984, WO2013/121985, WO2013/121986, WO2014/163004, WO2014/175124, WO2015/087902, JP-A-2013-227279, JP-A-2013-241569, JP-A-2013-256643, JP-A-2014-15609, JP-A-2014-37548, JP-A-2014-65884, JP-A-2014-210258, JP-A-2014-218639, JP-A-2015-200884, JP-A-2015-221888, WO2013/146112, WO2013/187432, WO2014/069592, WO2015/099085, WO2015/166760, JP-A-2013-144726, JP-A-2014-77836, JP-A-2013-117012, JP-A-2014-214194, JP-A-2014-198822, JP-A-2015-129230, JP-A-2015-196723, JP-A-2015-13983, JP-A-2015-199915, JP-A-2015-199906, etc.

Compound (A1)

As the compound (A), fluorinated ether compounds described in WO2014/163004, WO2013/121984 and JP-A-2015-199906 and the following compound (A1) are preferred.

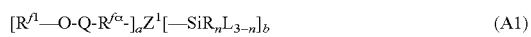
(A1)

Here, $R^{f1}$, Q, L, R, n and b are, respectively, as defined above, $R^{fα}$ is the chain α, $Z^1$ is a (a+b)-valent linking group, a is an integer of at least 1, when a is at least 2, a [$R^{f1}$—O-Q-$R^{fα}$-] may be the same or different, and when b is at least 2, b [—$SiR_nL_{3-n}$] may be the same or different.

$R^{f1}$ is the same as $R^{f1}$ in the above group (II), and preferred modes thereof are also the same.

When a is at least 2, a $R^{f1}$ are preferably the same in the number of carbon atoms, and from the viewpoint of production efficiency, are preferably the same groups, i.e. the groups being the same in the number of carbon atoms and in the chemical structure. Being the same in the number of carbon atoms and in the chemical structure means that, for example, in a case where a is 2, two $R^{f1}$ are $CF_3CF_2CF_2$— (i.e. not a combination of $CF_3CF_2CF_2$— and $CF_3CF(CF_3)$— where the $R^{f1}$ are different in the chemical structure although the same in the number of carbon atoms).

Q is the same as Q in the group (II), and preferred modes thereof are also the same.

$R^{fα}$ being the chain α is as defined above, and preferred modes thereof are also the same.

L is the same as L in the group (I), and preferred modes thereof are also the same.

R is the same as R in the group (I), and preferred modes thereof are also the same.

n is the same as n in the group (I), and preferred modes thereof are also the same.

A preferred value for a is the same as the preferred number of chains a which the compound (A) has. That is, a is preferably an integer of from 1 to 3.

A preferred value for b is the same as the preferred number of groups (I) which the compound (A) has. That is, b is preferably an integer of from 1 to 10, more preferably an integer of from 2 to 5, particularly preferably an integer of 3 or 4.

$Z^1$ may, for example, be a (a+b)-valent substituted or unsubstituted hydrocarbon group, a (a+b)-valent group having an atom or group other than a hydrocarbon group, between carbon-carbon atoms and/or at a terminal of a substituted or unsubstituted hydrocarbon group, a (a+b)-valent organopolysiloxane group, etc.

The unsubstituted hydrocarbon group may, for example, be a linear or branched saturated hydrocarbon group, an aromatic hydrocarbon cyclic group (e.g. a group having (a+b) hydrogen atoms removed from an aromatic hydrocarbon ring such as a benzene ring, a naphthalene ring, etc.), a group composed of a combination of a linear or branched saturated hydrocarbon group and an aromatic hydrocarbon cyclic group (for example, a group having an alkyl group bonded as a substituent to the above aromatic hydrocarbon cyclic group, a group having an arylene group such as phenylene group between carbon atoms and/or at a terminal of the above saturated hydrocarbon group, etc.), a group composed of a combination of two or more aromatic hydrocarbon cyclic groups, etc. Among them, a linear or branched saturated hydrocarbon group is preferred. The number of carbon atoms in the unsubstituted hydrocarbon group is preferably at most 20.

The substituted hydrocarbon group is a group in which some or all of hydrogen atoms in the hydrocarbon group are substituted by substituents. As the substituents, a hydroxy group, a halogen atom such as a fluorine atom, a chlorine atom, a bromine atom or an iodine atom, an amino group, a nitro group, a cyano group, an amino carbonyl group, etc. may be mentioned.

The atom or group other than a hydrocarbon group, between carbon-carbon atoms and/or at a terminal of a hydrocarbon group may, for example, be an etheric oxygen atom (—O—), a thioetheric sulfur atom (—S—), an nitrogen atom (—N<), a silicon atom (>Si<), a carbon atom (>C<), —N($R^{15}$)—, —C(O)N($R^{15}$)—, —OC(O)N ($R^{15}$)—, —Si($R^{16}$)($R^{17}$)—, an organopolysiloxane group, —C(O)—, —C(O)—O—, —C(O)—S—, etc. Here, $R^{15}$ is a hydrogen atom, an alkyl group or a phenyl group, and $R^{16}$ and $R^{17}$ are each independently an alkyl group or a phenyl group. The number of carbon atoms in the alkyl group is preferably from 1 to 6.

The organopolysiloxane group may be linear, branched or cyclic.

Preferred Modes of Compound (A1)

As the compound (A1), from the viewpoint of further excellent friction durability and fingerprint stain removability of the vapor-deposited film, at least one member selected from the group consisting the following compound (A11), compound (A12) and compound (A13) is preferred.

"Compound (A11)"

Compound (A11) is represented by the following formula (A11).

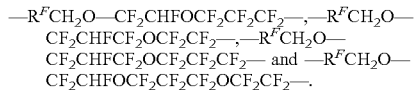
(A11)

where $R^{f1}$, Q, $R^{f\alpha}$, R and L have the same meanings as defined above, $Q^{32}$ is a $C_{1-20}$ fluoroalkylene group, or a group having an etheric oxygen atom between carbon-carbon atoms in a $C_{2-20}$ fluoroalkylene group (but excluding a case where a fluoroalkylene group bonded to an etheric oxygen atom at one terminal and bonded to $R^{f\alpha}$ at the other terminal, is a perfluoroalkylene group).

$R^{33}$ is a hydrogen atom or a $C_{1-6}$ alkyl group.

p1 is 0 or 1, n1 is an integer of from 0 to 2, $R^{34}$ is a single bond, a $C_{1-6}$ alkylene having, a group having an etheric oxygen atom at a terminal (a terminal on the side bonded to C[—$R^{35}$—SiR$_{n1}$L$_{3-n1}$]$_3$) of such an alkylene group, a group having an etheric oxygen atom between carbon-carbon atoms in a $C_{2-6}$ alkylene group, or a group having an etheric oxygen atom at a terminal (a terminal on the side bonded to C[—$R^{35}$—SiR$_{n1}$L$_{3-n1}$]$_3$) and between carbon-carbon atoms in a $C_{2-6}$ alkylene group, $R^{35}$ is a $C_{1-6}$ alkylene group, a group having an etheric oxygen atom at a terminal (but excluding the terminal on the side bonded to Si) of such a alkylene group, or a group having an etheric oxygen atom between carbon-carbon atoms in a $C_{2-6}$ alkylene group, and three [—$R^{35}$—SiR$_{n1}$L$_{3-n1}$] may be the same or different.

In $Q^{32}$, the $C_{1-20}$ fluoroalkylene group is preferably a perfluoroalkylene group or a fluoroalkylene group containing at least one hydrogen atom. The fluoroalkylene group is preferably linear from the viewpoint of friction resistance and lubricity of the surface layer.

As the group having an etheric oxygen atom between carbon-carbon atoms in a $C_{2-20}$ fluoroalkylene group, for example, a group of the later-described (ii) may be mentioned.

$Q^{32}$ is preferably a $C_{1-20}$ perfluoroalkylene group, a $C_{1-20}$ fluoroalkylene group containing at least one hydrogen atom, or a group having an etheric oxygen atom between carbon-carbon atoms in a $C_{2-20}$ fluoroalkylene group having at least one hydrogen atom.

$R^{f\alpha}$ contains at least 4 ($CF_2O$), and the number of ($CF_2O$) in $Q^{32}$ is preferably from 0 to 3.

In a case where p1 is 0, and $R^{f\alpha}$ is {($CF_2O$)$_{m11}$($CF_2CF_2O$)$_{m12}$}, $Q^{32}$ is typically a perfluoroalkylene group having one carbon atom.

In a case where p1 is 1, as $Q^{32}$, the following groups may be mentioned.

(i) a perfluoroalkylene group.

(ii) a group having $R^FCH_2O$ (where $R^F$ is a 01-6 perfluoroalkylene group) on the side bonded to $R^{f\alpha}$ and a fluoroalkylene group (which may have an etheric oxygen atom between carbon-carbon atoms) containing at least one hydrogen atom on the side bonded to $C(O)N(R^{33})$.

As $Q^{32}$ of (ii), from the viewpoint of production efficiency of the compound (A11), the following groups are preferred.

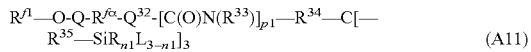

According to the compound (A11) wherein $Q^{32}$ is linear, it is possible to form a vapor-deposited film excellent in friction durability and lubricity.

Depending upon whether p1 in the $[C(O)N(R^{33})]_{p1}$ group is 0 or 1, characteristics of the fluorinated ether compound do not substantially change. When p1 is 1, the compound has an amide bond, but since at least one fluorine atom is bonded to the carbon atom at the terminal on the side bonded to $[C(O)N(R^{33})]$ of $Q^{32}$, the polarity of the amide bond tends to be small, and the water/oil repellency of the vapor-deposited film tends to be hardly lowered. Whether p1 should be 0 or 1, may be selected from the viewpoint of the production efficiency.

$R^{33}$ in the $[C(O)N(R^{33})]_{p1}$ group is preferably a hydrogen atom, from the viewpoint of the production efficiency of the compound (A11).

In a case where $R^{33}$ is an alkyl group, the alkyl group is preferably a $C_{1-4}$ alkyl group.

When p1 is 0, $R^{34}$ is, from the viewpoint of the production efficiency of the compound (A11), preferably a single bond, or a group (provided that the left side is bonded to $Q^{32}$) selected from the group consisting of —$CH_2O$—, —$CH_2OCH_2$—, —$CH_2OCH_2CH_2O$— and —$CH_2OCH_2CH_2OCH_2$—.

When p1 is 1, $R^{34}$ is, from the viewpoint of the production efficiency of the compound (A11), preferably a single bond, or a group selected from the group consisting of —$CH_2$— and —$CH_2CH_2$—.

From the viewpoint of the production efficiency of the compound (A11), $R^{35}$ is preferably a group (provided that the right side is bonded to Si) selected from the group consisting of —$CH_2CH_2$—, —$CH_2CH_2CH_2$—, —$CH_2OCH_2CH_2CH_2$— and —$OCH_2CH_2CH_2$—.

As $R^{35}$, from the viewpoint of excellent light resistance of the vapor-deposited film, one having no etheric oxygen atom is particularly preferred. In a touch panel for outdoor use (a digital signage such as a vending machine or a guide plate) or a touch panel mounted on a vehicle, light resistance is required in the water/oil repellent layer.

The three $R^{35}$ in the compound (A11) may be the same or different.

As the compound (A11), for example, compounds of the following formulae may be mentioned. These compounds are preferred from such a viewpoint that they are easy to industrially produce and easy to handle, and the vapor-deposited film is more excellent in water/oil-repellency, friction durability, fingerprint stain removability, lubricity, and appearance.

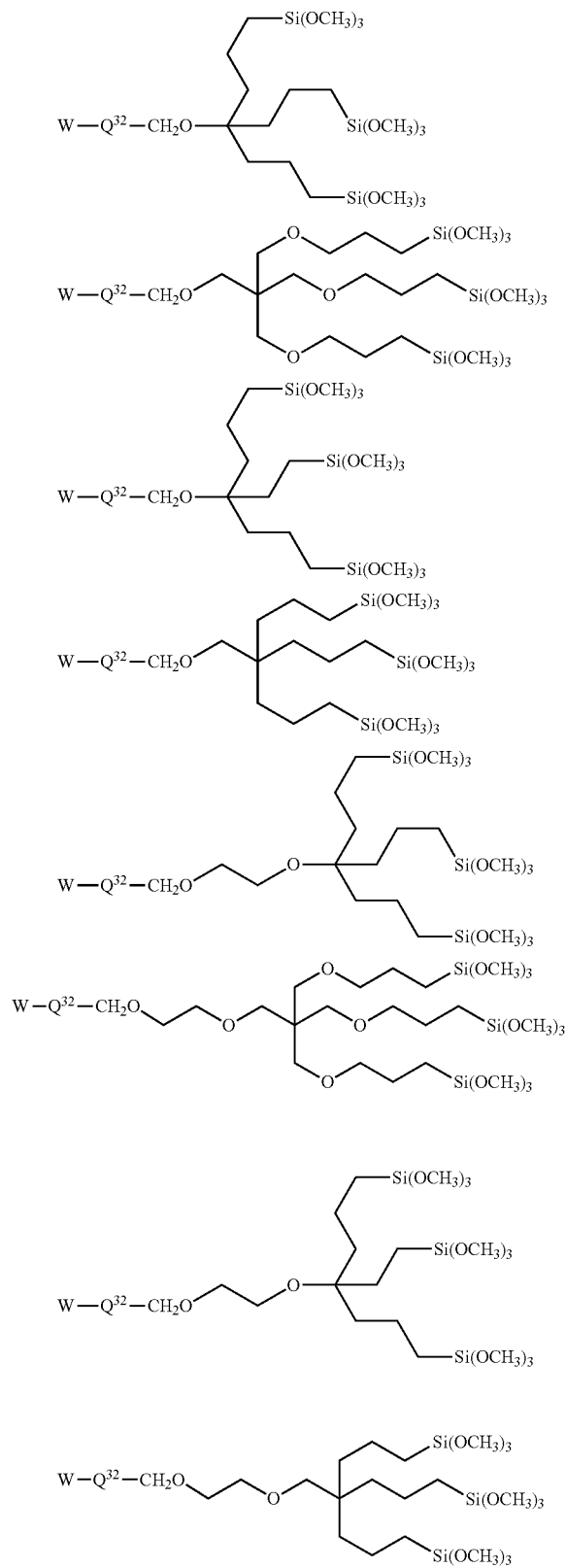

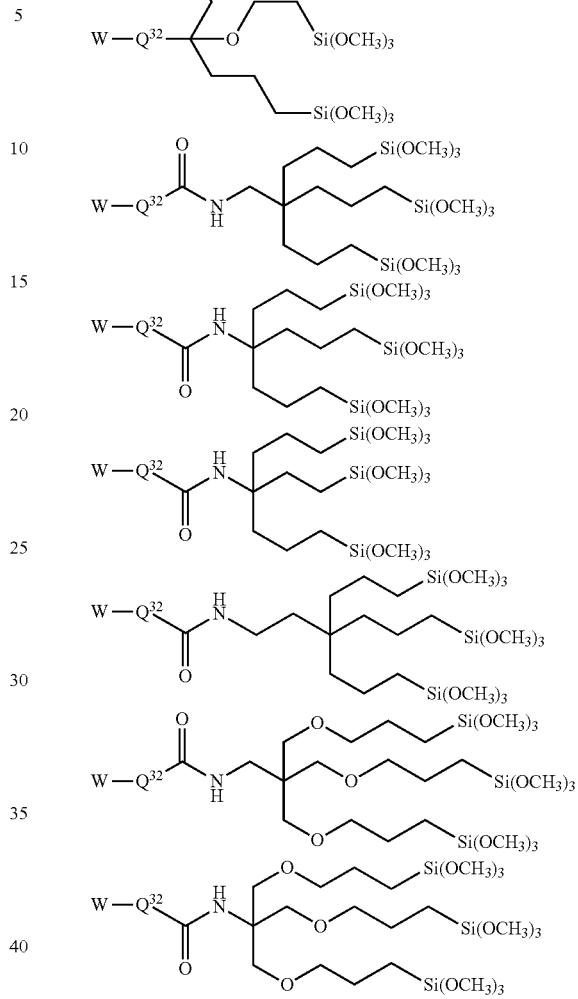

Here, W in these formula is $R^{f1}$—O-Q-$R^{f\alpha}$. A preferred mode of W becomes to be one having the above-mentioned preferred $R^{f1}$, Q and $R^{f\alpha}$ combined. The preferred range of $Q^{32}$ is as described above.

"Compound (A12)"

Compound (A12) is represented by the following formula (A12).

$$R^{f1}\text{—O-Q-}R^{f\alpha}\text{—}R^{42}\text{—}R^{43}\text{—N[—}R^{44}\text{—SiR}_{n2}L_{3-n2}]_2 \quad (A12)$$

where $R^{f1}$, Q, $R^{f\alpha}$, R and L respectively have the same meanings as defined above, n2 is an integer of from 0 to 2, $R^{42}$ is a $C_{1-6}$ perfluoroalkylene group, $R^{43}$ is a single bond, a $C_{1-6}$ alkylene group, a group having an etheric oxygen atom or —NH— at a terminal (but excluding the terminal on the side bonded to N) of such an alkylene group, a group having an etheric oxygen atom or —NH— between carbon-carbon atoms of a $C_{2-6}$ alkylene group, or a group having an etheric oxygen atom or —NH— at a terminal (but excluding the terminal on the side bonded to N) and between carbon-carbon atoms of a $C_{2-6}$ alkylene group, $R^{44}$ is a $C_{1-6}$ alkylene group, or a group having an etheric oxygen atom or —NH-between carbon-carbon atoms in a $C_{2-6}$ alkylene group, and two [—$R^{44}$—$SiR_{n2}L_{3-n2}$] may be the same or different.

$R^{42}$ is preferably a linear perfluoroalkylene group. When $R^{42}$ is a linear perfluoroalkylene group, friction durability and lubricity of the vapor-deposited film will be more excellent.

When $R^{f\alpha}$ is $\{(CF_2O)_{m11}(CF_2CF_2O)_{m12}\}$, $R^{42}$ is typically a perfluoroalkylene group having one carbon atom.

As $R^{43}$, from the viewpoint of the production efficiency of the compound (A12), a group (provided that the left side is bonded to $R^{42}$) selected from the group consisting of —$CH_2$—, —$CH_2CH_2$—, —$CH_2CH_2CH_2$—, —$CH_2OCH_2CH_2$— and —$CH_2NHCH_2CH_2$— is preferred.

Since $R^{43}$ does not have an ester bond which has a high polarity and is insufficient in chemical resistance and light resistance, the vapor-deposited film will be excellent in the initial water repellency, chemical resistance and light resistance.

As $R^{44}$, from the viewpoint of the production efficiency of the compound (A12), —$CH_2CH_2CH_2$— or —$CH_2CH_2OCH_2CH_2CH_2$— (provided that the right side is bonded to Si) is preferred.

Since $R^{44}$ does not have an ester bond which has a high polarity and is insufficient in chemical resistance and light resistance, the vapor-deposited film will be excellent in the initial water repellency, chemical resistance and light resistance.

As $R^{44}$, from the viewpoint of excellent light resistance of the vapor-deposited film, one having no etheric oxygen atom is particularly preferred.

Two $R^{44}$ in the compound (A12) may be the same or different.

As the compound (A12), for example, compounds of the following formulae may be mentioned. These compounds are preferred from such a viewpoint that they are easy to industrially produce and easy to handle, and are further excellent in water/oil-repellency, friction durability, fingerprint stain removability, lubricity, chemical resistance and light resistance.

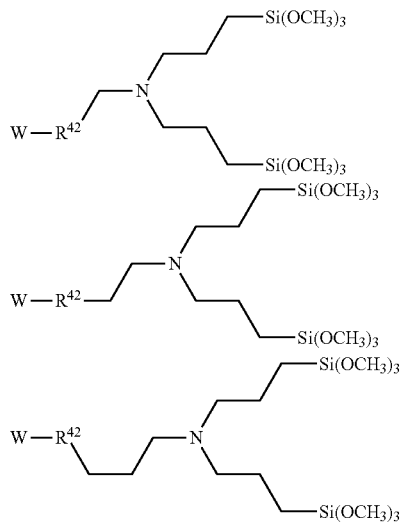

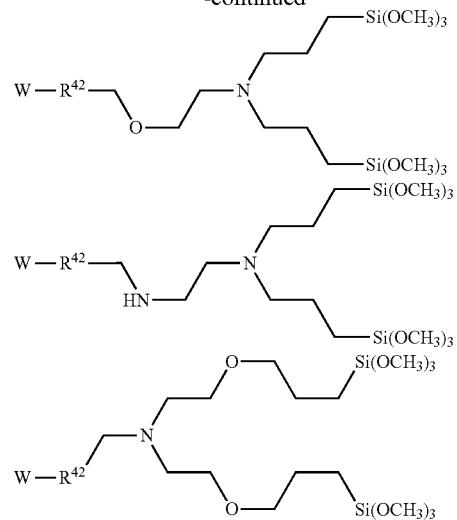

Here, W in these formulae is $R^{f1}$—O-Q-$R^{f\alpha}$—. A preferred mode of W becomes to be one having the above-mentioned preferred $R^{f1}$, Q and $R^{f\alpha}$ combined. The preferred range of $R^{42}$ is as described above.

"Compound (A13)"

Compound (A13) is represented by the following formula (A13).

$$[R^{f1}\text{—O-Q-}R^{f\alpha}\text{—}R^{51}\text{—}R^{52}\text{—O-}]_e Z^3[\text{O—}R^{53}\text{—}SiR_nL_{3-n}]_f \quad (A13)$$

where $R^{f1}$, Q, $R^{f\alpha}$, R, L and n have the same meanings as defined above, $R^{51}$ is a $C_{1-6}$ perfluoroalkylene group, $R^{52}$ is a $C_{1-6}$ alkylene group, $Z^3$ is a (e+f)-valent hydrocarbon group or a (e+f)-valent group with at least two carbon atoms, having at least one etheric oxygen atom between carbon-carbon atoms in a hydrocarbon group, $R^{53}$ is a $C_{1-20}$ alkylene group, e is an integer of at least 1, f is an integer of at least 1, (e+f) is at least 3, when e is 1, f is at least 4, and when e is at least 2, f is at least 1, when e is at least 2, e [$R^{f1}$—O-Q-$R^{f\alpha}$—$R^{51}$—$R^{52}$—O-] may be the same or different, and when f is at least 2, f [—O—$R^{53}$—$SiR_nL_{3-n}$] may be the same or different.

For example, in a case where $R^{f\alpha}$ is $\{(CF_2O)_{m11}(CF_2CF_2O)_{m12}\}$, $R^{51}$ is —$CF_2$—.

$R^{51}$ is preferably linear. With the compound (A13) wherein $R^{51}$ is linear, it is possible to form a vapor-deposited film excellent in friction durability and lubricity.

As $R^{52}$, from the viewpoint of the production efficiency of the compound (A13), a $C_{1-4}$ alkylene group is preferred, and —$CH_2$— is particularly preferred.

As the $R^{f1}$—O-Q-$R^{f\alpha}$—$R^{51}$— group, from such a viewpoint that the vapor-deposited film will be more excellent in water/oil repellency, friction durability, fingerprint stain removability, lubricity and appearance, and from the viewpoint of the production efficiency of the compound (A13), the group ($R^f$-1) or the group ($R^f$-2) is preferred.

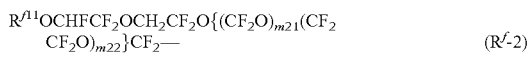

where $R^{f11}$ is a $C_{1-20}$ linear perfluoroalkyl group, m21 and m22 are respectively an integer of at least 1, m21+m22 is an integer of from 2 to 200, and the bonding order of m21 $CF_2O$ and m22 $CF_2CF_2O$ is not limited.

$Z^3$ may be a residue obtained by removing hydroxy groups from a polyhydric alcohol having (e+f) hydroxy groups.

As specific examples of $Z^3$, for example, groups of the following formulae may be mentioned. As $Z^3$, from the viewpoint of excellent reactivity of hydroxy groups, a residue obtained by removing hydroxy groups from a polyhydric alcohol having primary hydroxy groups, is preferred, and from the viewpoint of availability of raw materials, group (Z-1), group (Z-2) or group (Z-3) is particularly preferred. Here, $R^4$ is an alkyl group, and a methyl group or an ethyl group is preferred.

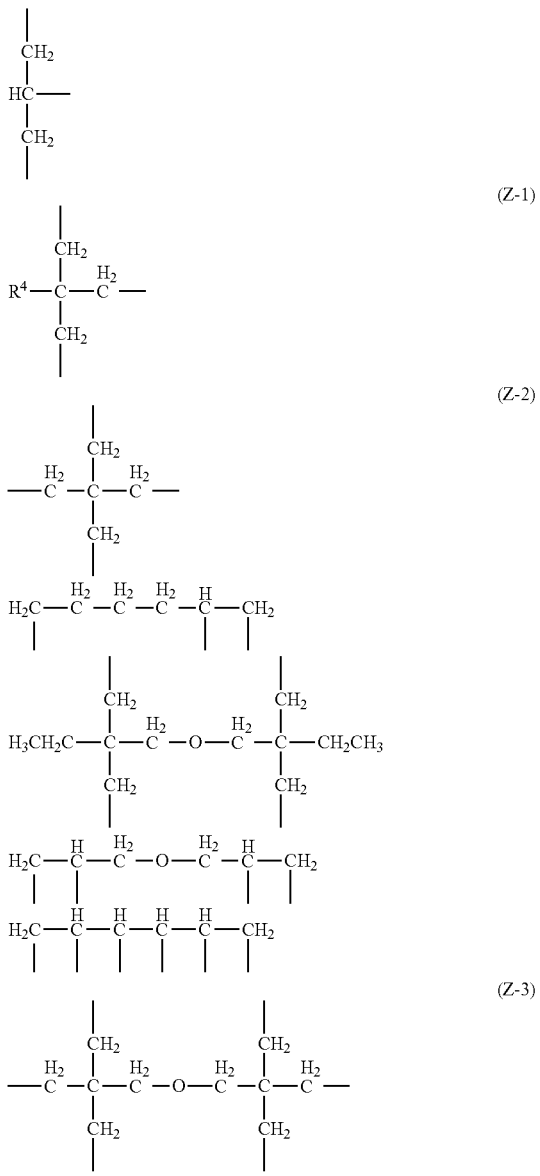

As $R^{53}$, from the viewpoint of the production efficiency of the compound (A13), a $C_{3-14}$ alkylene group is preferred. Further, from such a viewpoint that at the time of the hydrosilylation in the later-described production of the compound (A13), a by-product having some or all of allyl groups ($-CH_2CH=CH_2$) isomerized to the inner olefins ($-CH=CHCH_3$), is less likely to be formed, a $C_{4-10}$ alkylene group is particularly preferred.

e is preferably from 1 to 10, particularly preferably from 1 to 4. When e is at least the lower limit value in the above range, the vapor-deposited film will be excellent in water/oil repellency, friction durability, fingerprint stain removability and lubricity. When e is at most the upper limit value in the above range, the vapor-deposited film will be excellent in appearance.

(e+f) is preferably from 3 to 15, particularly preferably from 3 to 12.

When e is 1, f is at least 4, preferably from 4 to 10, particularly preferably from 4 to 5. If when e is 1, f is at least 4, the vapor-deposited film will be excellent in friction durability. When f is at most the upper limit value in the above range, the appearance of the vapor-deposited film, and the stability of the compound (A13) will be excellent.

When e is an integer of at least 2, f is an integer of at least 1, preferably an integer of from 1 to 10, particularly preferably an integer of from 1 to 4. When e is an integer of at least 2, the density of $R^{f1}-O-Q-R^{f\alpha}-R^{51}-R^{52}-O-$ groups in the vapor-deposited film becomes high, whereby the vapor-deposited film will be excellent in lubricating properties, and the friction force will be less likely to be exerted to the vapor-deposited film. Therefore, even if f is 1, the vapor-deposited film will be excellent in friction durability. When f is at most the upper limit value in the above range, the appearance of the vapor-deposited film and the stability of the compound (A13) will be excellent.

As the compound (A13), for example, compounds (1-1) to (1-6) of the following formulae may be mentioned. These compounds are preferred from such a viewpoint that they are easy to industrially produce and easy to handle, and the vapor-deposited film will be further excellent in water/oil repellency, friction durability, fingerprint stain removability, lubricity and appearance.

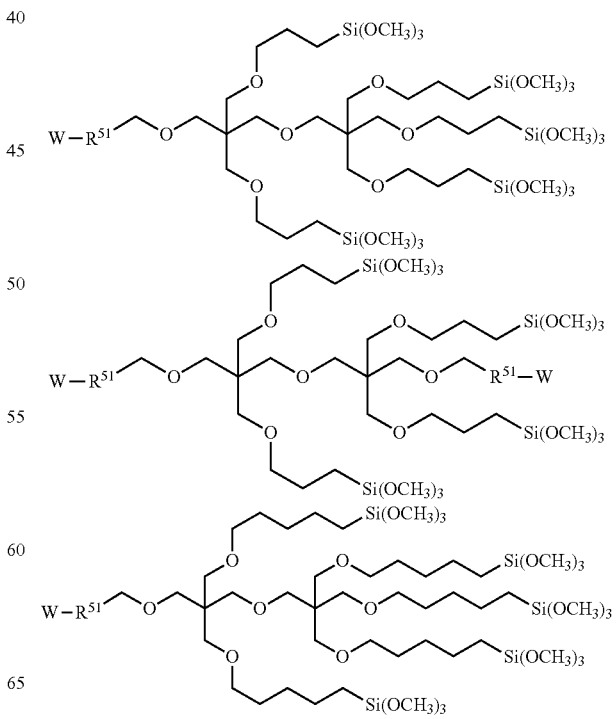

-continued

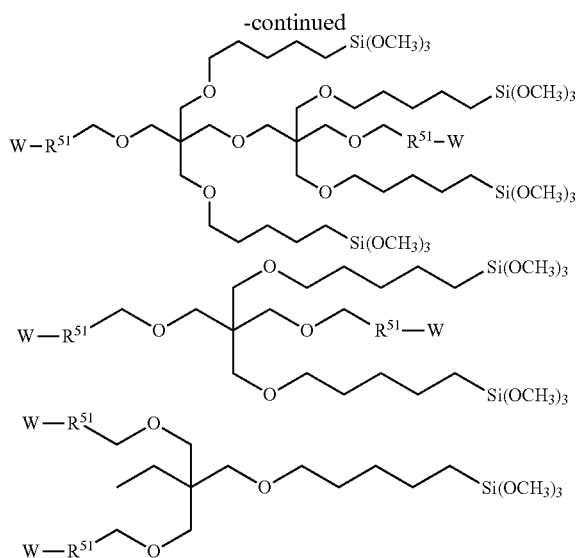

Here, W in these formulae is $R^{f1}$—O-Q-$R^{f\alpha}$—. A preferred mode of W becomes to be one having the above-mentioned preferred $R^{f1}$, Q and $R^f$ combined. A preferred mode of $R^{51}$ is as described above.

(Partial condensate (B))

The partial condensate (B) is a partial condensate of the compound (A). That is, it is a multimer to be formed by a dehydration condensation reaction of hydroxy groups formed by decomposition of some of the hydrolyzable groups in the groups (I) which the compound (A) has, or by a dehydration condensation reaction of the hydroxy groups one another in the groups (I).

The number average molecular weight (Mn) of the partial condensate (B) is preferably from 4,000 to 30,000, more preferably from 5,000 to 25,000, particularly preferably from 6,000 to 20,000. When the number average molecular weight of the partial condensate (B) is at least the lower limit value in the above range, it will be excellent in friction durability. When the number average molecular weight of the partial condensate (B) is at most the upper limit value in the above range, the vapor pressure will be less likely to be too low.

The partial condensate (B) is preferably one having from 2 to 4 compounds (A) condensed, more preferably one having 2 or 3 compounds (A) condensed. The number of compounds (A) to be condensed being at least the lower limit value in the above range, is preferred in that it is thereby possible to form, by vapor deposition, a layer of the partial condensate (B) on a layer of the compound (A). When the number of compounds (A) to be condensed, is at most the upper limit value in the above range, the vapor pressure will be less likely to be too low.

Since the compound (A) has at least one group L, in the partial condensate (B), at least one group L, usually at least two groups L, are present. The partial condensate (B) has preferably from 1 to 12 groups L, more preferably from 2 to 9 groups L, per molecule.

The partial condensate (B) is preferably such that all the molecules have at least one group L.

When the number of groups L in the partial condensate (B) is at least the lower limit value in the above range, at the time of forming, by vapor deposition, a layer of the partial condensate (B) on a layer of the compound (A), the adhesion of the two layers becomes high, such being preferred.

Further, when the number of groups L in the partial condensate (B) is at most the upper limit value in the above range, it will be excellent in the antifouling property.

(Another Fluorinated Ether Compound)

The present composition may be one comprising the compound (A) and the partial condensate (B), or may be one further containing another fluorinated ether compound other than the compound (A) and the partial condensate (B).

Another fluorinated ether compound may, for example, be a fluorinated ether compound (hereinafter referred to also as compound (C)) having a poly(oxyperfluoroalkylene) chain and having no group (I).

As the compound (C), for example, compound ($C_1$) may be mentioned.

$$A^{31}\text{-O-}Q^{51}(R^{F3}O)_{m30}\text{-}[Q^{52}\text{-O}]_{p3}\text{-}A^{32} \quad (C1)$$

Here, $A^{31}$ and $A^{32}$ are each independently a $C_{1-20}$ perfluoroalkyl group, $Q^{51}$ is a single bond, a $C_{2-10}$ oxyfluoroalkylene group containing at least one hydrogen atom, or a polyoxyfluoroalkylene group having from 2 to 5 (preferably from 2 to 4) such oxyfluoroalkylene groups bonded, $Q^{52}$ is a $C_{1-10}$ fluoroalkylene group containing at least one hydrogen atom, or a group having an etheric oxygen atom between carbon-carbon atoms in a $C_{2-10}$ fluoroalkylene group containing at least one hydrogen atom (provided that the number of oxygen atoms is at most 10), $R^{F3}$ is a $C_{1-6}$ perfluoroalkylene group, m30 is an integer of from 2 to 200, $(R^{F3}O)_{m30}$ may be one composed of at least two types of $R^{F3}O$ different in the number of carbon atoms, and p3 is 0 when $Q^{51}$ is a single bond, and is 1 when $Q^{51}$ is other than a single bond.

As the compound ($C_1$), one produced by a known production method may be used, or a commercially available product may be used.

For example, as the compound (C1) wherein $Q^{51}$ is a single bond and p3 is 0, FOMBLIN (registered trademark) M, FOMBLIN (registered trademark) Y, FOMBLIN (registered trademark) Z (manufactured by Solvay Solexis), Krytox (registered trademark) (manufactured by Du Pont), or DEMNUM (registered trademark) (manufactured by Daikin Industries, Ltd.) may be mentioned.

(Composition of the Present Composition)

In the present composition, the proportion of the partial condensate (B) to the total amount of the compound (A) and the partial condensate (B) is from 4 to 40 mass %. The proportion of the partial condensate (B) to the total amount of the compound (A) and the partial condensate (B) is preferably from 5 to 35 mass %, particularly preferably from 20 to 32 mass %, from such a viewpoint that it is thereby possible to obtain a vapor-deposited film excellent in friction durability.

Here, in the present invention, the proportion of the partial condensate (B) to the total amount of the compound (A) and the partial condensate (B) was obtained by a gel permeation chromatography (GPC) method, from the peak fitting assuming a Gaussian distribution. That is, it is the value of [(area of peak 2)/(area of peak 1+area of peak 2)] where the first peak 1 is deemed to be due to the compound (A), and the second peak 2 is deemed to be due to the partial condensate (B).

In the present composition, the total amount of the compound (A) and the partial condensate (B) is preferably at least 10 mass %, particularly preferably at least 20 mass %, based on the total mass of the present composition. The upper limit is not particularly limited and may be 100 mass %.

The present composition may contain a catalyst for hydrolysis and dehydration condensation. As the catalyst, an optional acid or base may be used. As the acid catalyst, acetic acid, formic acid, trifluoroacetic acid or the like may be mentioned. As the base catalyst, ammonia, an organic amine or the like may be mentioned.

The present composition may contain impurities other than the compound (A), the partial condensate (B), another fluorinated ether compound and the catalyst. The impurities other than the compound (A), the partial condensate (B), another fluorinated ether compound and the catalyst, may be compounds unavoidable in the production of the compound (A), the partial condensate (B) and another fluorinated ether compound.

Here, the present composition does not contain a liquid medium which will be described later.

(Production Method for the Present Composition)

The present composition can be produced by letting a part of the compound (A) wherein L is a hydroxy group, undergo a condensation reaction, or by letting a part of the compound (A) wherein L is a hydrolysable group, undergo hydrolysis and condensation reactions.

In order to adjust the proportion of the partial condensate (B) to the total amount of the compound (A) and the partial condensate (B), the amount of water to be added, may be adjusted. If the amount of water to be added is increased, it is possible to increase the proportion of the partial condensate (B), and if the amount of water to be added is decreased, it is possible to lower the proportion of the partial condensate (B).

The proportion of the partial condensate (B) to the total amount of the compound (A) and the partial condensate (B), can be adjusted also by mixing two types of compositions different in the proportion of the partial condensate (B), in a suitable mixing ratio. For example, by mixing a composition containing the compound (A) as the main component and a composition containing the partial condensate (B) as the main component, it is possible to adjust the proportion of the partial condensate (B).

[Coating Liquid]

The coating liquid of the present invention (hereinafter referred to also as the present coating liquid) comprises the present composition and a liquid medium. The present coating liquid may be a solution or may be a dispersion.

The concentration of the present composition is preferably from 5 to 30 mass %, particularly preferably from 10 to 25 mass %, in the present coating liquid.

As the liquid medium, an organic solvent is preferred. The organic solvent may be a fluorinated organic solvent or a non-fluorinated organic solvent, or may contain both solvents.

As the fluorinated organic solvent, a fluorinated alkane, a fluorinated aromatic compound, a fluoroalkyl ether, a fluorinated alkylamine, a fluoroalcohol or the like may be mentioned.

As the non-fluorinated organic solvent, a compound consisting solely of hydrogen atoms and carbon atoms, or a compound consisting solely of hydrogen atoms, carbon atoms and oxygen atoms is preferred, and a hydrocarbon-type solvent, an alcohol-type organic solvent, a ketone-type organic solvent, an ether-type organic solvent or an ester-type organic solvent may be mentioned.

The content of the liquid medium is preferably from 70 to 95 mass %, particularly preferably from 75 to 90 mass %, in the present coating liquid.

[Article]

The article of the present invention has a vapor-deposited film formed from the present composition on the surface of a substrate.

(Substrate)

The substrate in the present invention is not particularly limited so long as it is a substrate which is desired to impart lubricity and water/oil repellency. As the material of the substrate, a metal, a resin, glass, sapphire, ceramics, stone or a composite material thereof may be mentioned. The glass may have been chemically tempered. On the surface of the substrate, an underlying film such as a $SiO_2$ film may be formed.

As the substrate, a touch panel substrate or a display substrate is preferred, and a touch panel substrate is particularly preferred. The touch panel substrate has translucency. "Having translucency" means that the vertical incidence type visible light transmittance according to JIS R3106: 1998 (ISO 9050: 1990) is at least 25%. As the material of the touch panel substrate, glass or a transparent resin is preferred.

(Vapor-Deposited Film)

The vapor-deposited film of the present invention has a two-layer structure comprising a lower layer (on the substrate side) containing the compound (A) as the main component, and an upper layer containing the partial condensate of (B) as the main component. Because, at the time of vapor deposition, a compound (A) having a smaller molecular weight tends to firstly evaporate and deposit to the substrate.

The total thickness of the vapor-deposited film is preferably from 1 to 20 nm, particularly preferably from 3 to 15 nm. When the thickness of the vapor-deposited film is at least the lower limit value in the above range, the effects by the surface treatment tend to be sufficiently obtained. When the thickness of the vapor-deposited film is at most the upper limit value in the above range, the utilization efficiency is high. The thickness of the vapor-deposited film can be calculated from the oscillation period of the interference pattern of the reflected X-ray, by obtaining the interference pattern of the reflected X-ray by the X-ray reflectance method by means of an X-ray diffractometer for thin film analysis (manufactured by RIGAKU Corp., ATX-G).

(Method for Producing the Article)

The article of the present invention can be obtained by treating the surface of a substrate by a dry coating method using the present composition or the present coating liquid. The present composition is suitable for forming a vapor-deposited film excellent in adhesion by a dry coating method.

The present composition or the present coating liquid can be used as it is, in a dry coating method. Otherwise, vapor deposition may be carried out by using a pelletized material having the present composition impregnated in a metal porous body of e.g. iron or steel.

As the dry coating method, a vacuum vapor deposition method, a CVD method, a sputtering method, or the like may be mentioned. From the viewpoint of preventing the decomposition of the compound (A) and the partial condensate (B), and from the viewpoint of simplicity of the apparatus, the vacuum vapor deposition method is particularly preferred.

As the vacuum vapor deposition method, a resistance heating method, a high frequency heating method, an electron beam method, an ion beam method or the like may be mentioned.

The temperature at the time of the vacuum vapor deposition is preferably from 20 to 300° C., particularly preferably from 30 to 200° C.

The pressure at the time of the vacuum vapor deposition is preferably at most $1\times10^{-1}$ Pa, particularly preferably at most $1\times10^{-2}$ Pa.

The vapor deposition time from the start of heating to completion of the vapor deposition is preferably from 30 to 500 seconds, particularly preferably from 50 to 300 seconds. When the vapor deposition time is at least the lower limit value in the above range, the compound (A) and the compound (B) will be stepwise evaporated, such being preferred. When the vapor deposition time is at most the upper limit value in the above range, thermal decomposition of the compound (A) will be less likely to occur.

When the present composition is vapor-deposited, the profile of thickness to be deposited per second exhibits at least two peaks. This is attributable to that the compound (A) and the partial condensate (B) contained in the present composition are different in molecular weight and thus exhibit different vapor pressures. Among the peaks, the peak which appears first is mainly composed of the compound (A), and the second or subsequent peak is mainly composed of the partial condensate (B).

After Treatment

In order to improve the friction durability of the vapor-deposited film, if necessary, it is possible to carry out an operation to accelerate the reaction between the compound (A) and the partial condensate (B), and the substrate. As such an operation, heating, humidification, light irradiation or the like may be mentioned.

For example, by heating a substrate having a vapor-deposited film formed in the atmosphere having moisture, it is possible to accelerate a reaction such as a hydrolysis reaction of the hydrolyzable silyl groups to silanol groups, a reaction of the silanol groups and hydroxy groups on the surface of the substrate, or formation of siloxane bonds by a condensation reaction of silanol groups.

After the surface treatment, among compounds in the vapor-deposited film, compounds not chemically bonded to other compounds or to the substrate may be removed as the case requires. As a specific method, for example, a method of letting a solvent flow on the vapor-deposited film, or a method of wiping with a cloth soaked with a solvent, may be mentioned.

Advantageous Effects

In the present composition, because it contains the compound (A) and the partial condensate (B) in a specific ratio, it is possible to form a vapor-deposited film excellent in friction durability.

First, at the time of vapor deposition, the compound (A) which is firstly evaporated to form a layer in contact with the substrate, has a sufficient amount of groups L in groups (I). In a case where groups L are hydrolyzable groups, silanol groups will be formed by hydrolysis, and the silanol groups will undergo dehydration condensation with hydroxy groups at the surface of the substrate, whereby chemical bonds will be formed. In a case where groups L are hydroxy groups, their silanol groups will undergo dehydration condensation with hydroxy groups at the surface of the substrate, whereby chemical bonds will be formed. Accordingly, the vapor-deposited film can be firmly bonded to the substrate.

At the time of vapor deposition, the partial condensate (B) which is subsequently evaporated to form the outermost surface layer, has a large molecular weight, whereby it is possible to form a dense hard layer. That is, it is possible to increase the surface strength of the vapor-deposited film. Since groups L derived from the compound (A) will remain also in the partial condensate (B), they will undergo dehydration condensation with groups L of the compound (A) to form chemical bonds, whereby adhesion between the layer formed from the compound (A) and the layer formed from the partial condensate (B) will also be excellent.

The vapor-deposited film according to the present composition has high surface strength and adhesion, and thus is excellent in friction durability.

EXAMPLES

In the following, the present invention will be described in detail with reference to Examples, but the present invention is not limited thereto. Hereinafter, "%" is "mass %" unless otherwise specified. It is to be noted that Ex. 2 to 6, 9 and 10 are Examples of the present invention, and Ex. 1, 7, 8 and 11 are Comparative Examples.

[Evaluations]

(Number Average Molecular Weight)

The number average molecular weight of a fluorinated ether compound was measured by GPC under the following conditions.

Apparatus: HLC-8320GPC (manufactured by Tosoh Corporation).

Mobile phase: a mixed solvent of R-225 (manufactured by Asahi Glass Co., Ltd., ASAHIKLIN AK-225SEC Grade 1) and hexafluoroisopropyl alcohol (R-225: hexafluoroisopropyl alcohol=90:10 (volume ratio)).

Analytical column: KF806L (manufactured by Showa Denko KK).

Standard samples for molecular weight measurement: three types of perfluoropolyether having Mw/Mn of less than 1.1 and Mn of from 2,000 to 10,000.

Mobile phase flow rate: 1.0 mL/min.

Sample concentration: 10 mg/mL.

Column temperature: 37° C.

Detector: evaporative light scattering detector.

(Composition)

The proportion of the partial condensate (B) to the total amount of the compound (A) and the partial condensate (B) was obtained by a gel permeation chromatography (GPC) method, from peak fitting assuming a Gaussian distribution. That is, it was obtained from [(area of peak 2)/(area of peak 1+peak 2)] assuming that the first peak 1 is deemed to be due to the compound (A), and the second or subsequent peak 2 is deemed to be due to the partial condensate (B). For the peak fitting, the Igor Pro (manufactured by Wave Metrics, Inc.) was used. The chromatogram of GPC in Ex. 1 is shown in FIG. 1. In FIG. 1, the horizontal axis represents the molecular weight logarithm, and the vertical axis represents a value obtained by differentiating the concentration fraction with the logarithmic value of the molecular weight.

The proportion of the total amount of the compound (A) and the partial condensate and (B) to the entire composition, was obtained by drying the composition for vapor deposition at 20° C. under 200 Pa, to remove low volatility components such as the liquid medium.

Friction Durability

The contact angle (water contact angle) of about 2 μL of distilled water placed on the surface of the vapor-deposited film, was measured at 20° C. by using a contact angle measuring device (manufactured by Kyowa Interface Science Co., Ltd., DM-701). It was measured at five different points on the surface of the vapor-deposited film, and the average value was calculated and adopted as the initial contact angle. For the calculation of the contact angle, a 2θ method was used.

Thereafter, using a reciprocating traverse testing machine (manufactured by KNT Co.) in accordance with JIS L0849: 2013 (ISO 105-X12: 2001), Steel Wool Bon Star (#0000) was reciprocated 5,000 times under a pressure of 98.07 KPa at a speed of 320 cm/min, and the water contact angle after the reciprocation of 5,000 times (contact angle after friction), was investigated in the same manner as the initial contact angle.

By obtaining the difference (difference in the contact angle) between the initial contact angle and the contact angle after friction, the friction durability was evaluated. The smaller the difference in the contact angle, the better the friction durability.

Preparation of Composition (1)

Into a 300 mL three-necked flask, 24.4 g of a 24% KOH aqueous solution, 33 g of tert-butyl alcohol, and 220 g of compound (1) (manufactured by Solvay Solexis, FLUORO-LINK (registered trademark) D4000), were put, and 19.4 g of $CF_3CF_2CF_2$—O—$CF$=$CF_2$ (manufactured by Tokyo Kasei Kogyo Co., Ltd.) was added. Under a nitrogen atmosphere, stirring was continued at 60° C. for 8 hours. After washing once with dilute aqueous hydrochloric acid, the organic phase was recovered and concentrated by an evaporator to obtain 233 g of a crude product. The crude product was developed by a silica gel column chromatography and fractionated. As the developing solvent, $C_6F_{13}CH_2CH_3$ (manufactured by Asahi Glass Co., Ltd., AC-6000), AC-6000/$CF_3CH_2OCF_2CF_2H$ (manufactured by Asahi Glass Co., Ltd., AE-3000)=½ (mass ratio), and AE-3000/ethyl acetate=9/1 (mass ratio), were sequentially used. For each fraction, the structures of terminal groups and the average values for the number of units (x1, x2) of the constituting units, were obtained from the integral values of $^1$H-NMR and $^{19}$F-NMR. It was found that in the crude product, compound (2), compound (3) and compound (1) were, respectively, contained in amounts of 42 mol %, 49 mol % and 9 mol %. 98.6 g (yield: 44.8%) of compound (2) and 51.9 g (yield: 23.6%) of compound (3) were obtained.

$$HO-CH_2-(CF_2O)\{(CF_2O)_{x1}(CF_2CF_2O)_{x2}\}-CF_2-CH_2-OH \quad (1)$$

$$CF_3CF_2CF_2-O-CHFCF_2OCH_2-(CF_2O)\{(CF_2O)_{x1}(CF_2CF_2O)_{x2}\}-CF_2-CH_2-OH \quad (2)$$

$$CF_3CF_2CF_2-O-CHFCF_2OCH_2-(CF_2O)\{(CF_2O)_{x1}(CF_2CF_2O)_{x2}\}-CF_2-CH_2OCF_2CHF-O-CF_2CF_2CF_3 \quad (3)$$

In the formulae (1) to (3), the number of units x1: average value 21, and the number of units x2: average value 20. The number average molecular weight of compound (2): 4,150, and the number average molecular weight of compound (3): 4,420.

Into a 100 mL eggplant flask, 30.0 g of compound (2), 0.9 g of sodium fluoride powder, and 30 g of dichloropentafluoropropane (manufactured by Asahi Glass Co., Ltd., AK-225), were put, and 3.5 g of $CF_3CF_2CF_2OCF(CF_3)COF$ was added. Under nitrogen atmosphere, stirring was continued at 50° C. for 24 hours. After removal of sodium fluoride powder by a pressure filter, excess $CF_3CF_2CF_2OCF(CF_3)COF$ and AK-225 were distilled off under reduced pressure. The obtained crude product was diluted with $C_6F_{13}H$ (manufactured by Asahi Glass Co., Ltd., AC-2000) and passed through a silica gel column, and the recovered solution was concentrated by an evaporator, to obtain 31.8 g (yield: 98.8%) of compound (4).

$$CF_3CF_2CF_2-O-CHFCF_2OCH_2-(CF_2O)\{(CF_2O)_{x1}(CF_2CF_2O)_{x2}\}-CF_2-CH_2-OCOCF(CF_3)OCF_2CF_2CF_3 \quad (4)$$

The average value for the number of units x1: 21, the average value for the number of units x2: 20, and the number average molecular weight of compound (4): 4,460.

At the gas outlet of a 1 L nickel autoclave, a cooler maintained at 20° C., a NaF pellet packed layer and a cooler maintained at 0° C. were installed in series. A liquid returning line to return a liquid aggregated from the cooler maintained at 0° C. to the autoclave, was installed.

Into the autoclave, 750 g of $ClCF_2CFClCF_2OCF_2CF_2Cl$ (hereinafter referred to also as CFE-419) was put and stirred while maintaining 25° C. After blowing nitrogen gas into the autoclave at 25° C. for 1 hour, 20% fluorine gas was blown in for one hour at 25° C. at a flow rate of 2.0 L/hr. While blowing the 20% fluorine gas in at the same flow rate, a solution having 31.0 g of compound (4) dissolved in 124 g of CFE-419 was injected into the autoclave over a period of 4.3 hours. While blowing the 20% fluorine gas in at the same flow rate, the internal pressure of the autoclave was raised to 0.15 MPa (gauge pressure). Into the autoclave, 4 mL of a benzene solution containing 0.05 g/mL benzene in CFE-419, was injected while heated from 25° C. to 40° C., and then, the benzene solution inlet of the autoclave was closed. After stirring for 15 minutes, 4 mL of the benzene solution was injected again while maintaining 40° C., and then, the inlet was closed. The same operation was repeated three more times. The total amount of benzene injected was 0.17 g. While blowing the 20% fluorine gas in at the same flow rate, stirring was continued for 1 hour. The pressure in the autoclave was made to be at atmospheric pressure, and nitrogen gas was blown in for 1 hour. The content of the autoclave was concentrated by an evaporator to obtain 31.1 g (yield: 98.5%) of compound (5).

$$CF_3CF_2CF_2-O-(CF_2CF_2O)(CF_2CF_2O)\{(CF_2O)_{x1}(CF_2CF_2O)_{x2}\}(CF_2CF_2O)-COCF(CF_3)OCF_2CF_2CF_3 \quad (5)$$

The average value for the number of units x1: 21, the average value for the number of units x2: 20, and the number average molecular weight of compound (5): 4,550.

Into a round bottomed flask made of a tetrafluoroethylene-perfluoro(alkoxy vinyl ether) copolymer (hereinafter referred to also as PFA), 30.0 g of compound (5) and 60 g of AK-225 were put. While stirring and cooling in an ice bath, under a nitrogen atmosphere, 2.0 g of methanol was slowly dropwise added from a dropping funnel. While bubbling with nitrogen, the mixture was stirred for 12 hours. The reaction mixture was concentrated by an evaporator to obtain 27.6 g (yield: 98.8%) of compound (6).

$$CF_3CF_2CF_2-O-(CF_2CF_2O)(CF_2CF_2O)\{(CF_2O)_{x1}(CF_2CF_2O)_{x2}\}-CF_2-COOCH_3 \quad (6)$$

The average value for the number of units x1: 21, the average value for the number of units x2: 20, and the number average molecular weight of compound (6): 4,230.

In a 100 mL three-necked eggplant flask, 0.18 g of lithium chloride was dissolved in 18.3 g of ethanol. 25.0 g of compound (6) was added thereto, and while cooling in an ice bath, a solution having 0.75 g of sodium borohydride dissolved in 22.5 g of ethanol was slowly dropwise added. The ice bath was removed, and stirring was continued while slowly raising the temperature to room temperature. After stirring at room temperature for 12 hours, an aqueous hydrochloric acid solution was dropwise added until the liquid became acidic. 20 mL of AC-2000 was added, followed by washing once with water and once with saturated brine, whereupon the organic phase was recovered. The recovered organic phase was concentrated by an evaporator to obtain 24.6 g (yield: 99.0%) of compound (7).

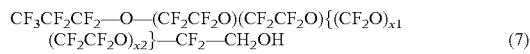

(7)

The average value for the number of units x1: 21, the average value for the number of units x2: 20, and the number average molecular weight of compound (7): 4,200.

Into a 100 mL two-necked eggplant flask, 20.0 g of compound (7), 0.21 g of tetrabutylammonium hydrogen sulfate, 1.76 g of $BrCH_2CH=CH_2$ and 2.6 g of a 30% sodium hydroxide aqueous solution were added and stirred at 60° C. for 8 hours. After completion of the reaction, 20 g of AC-2000 was added, followed by washing once with a dilute aqueous hydrochloric acid, whereupon the organic phase was recovered. The recovered organic phase was passed through a silica gel column, and the recovered solution was concentrated by an evaporator to obtain 19.8 g (yield: 98.2%) of compound (8).

(8)

The average value for the number of units x1: 21, the average value for the number of units x2: 20, and the number average molecular weight of compound (8): 4,250.

Into a 100 mL eggplant flask made of PFA, 5.0 g of compound (8), 0.005 g of a xylene solution (platinum content: 2%) of a platinum/1,3-divinyl-1,1,3,3-tetramethyl-disiloxane complex, 0.25 g of $HSi(OCH_3)_3$, 0.005 g of dimethyl sulfoxide and 0.20 g of 1,3-bis(trifluoromethyl)benzene (manufactured by Tokyo Kasei Kogyo Co., Ltd.) were put and stirred at 40° C. for 4 hours. After completion of the reaction, the solvent, etc. were distilled off under reduced pressure, followed by filtration through a membrane filter having a pore size of 0.2 μm, to obtain 4.9 g (yield: 95%) of composition (1) comprising compound (9) having one allyl group in compound (8) hydrosilylated, and a by-product having one allyl group in compound (8) isomerized to an inner olefin ($-CH=CHCH_3$). Conversion in the hydrosilylation was 100%, and compound (8) did not remain. Selectivity in the hydrosilylation was 95%.

(9)

NMR spectrum of compound (9);
$^1$H-NMR (300.4 MHz, solvent: $CDCl_3$, reference: TMS) δ (ppm): 0.7 (6H), 1.7 (6H), 3.6 (11H), 3.8 (2H).
$^{19}$F-NMR (282.7 MHz, solvent: $CDCl_3$, reference: $C_6F_6$) δ (ppm): −52.4 to −55.8 (42F), −78.2 (1F), −80.2 (1F), −82.2 (3F), −89.4 to −91.1 (90F), −130.5 (2F).

The average value for the number of units x1: 21, the average value for the number of units x2: 20, and the number average molecular weight of compound (9): 4,370.

Preparation of Composition (2)

Into a 20 mL screw tube, 8 g of HFE7200 (hydrofluoroether, trade name: Novec-7200, manufactured by 3M Co.) having the water content reduced to 10 ppm by dehydration treatment, and 2 g of composition (1), were put and stirred at room temperature for 1 hour to obtain composition (2).

Composition (2) was analyzed by GPC, whereby the number average molecular weight of the compound (A) was 4,650, the number average molecular weight of the partial condensate (B) was 9,230, and the proportion of the partial condensate (B) to the total amount of the compound (A) and the partial condensate (B) was 2 mass %.

Preparation of Composition (3)

Into a 0.5 L autoclave made of SUS, 200 g of HFE7200 and 10 g of distilled water were put, heated to 80° C. and stirred for 3 hours. Then, moisture insoluble in HFE7200 was removed, followed by measurement by the Karl Fischer method, whereby the amount of water dissolved in HFE7200 was 80 ppm.

Into a 0.5 L autoclave made of SUS, 16 g of the above HFE7200 having water dissolved therein, 4 g of composition (1), and 0.4 mg of diethylamine, were put and stirred at 60° C. for 24 hours, to obtain composition (3).

Composition (3) was analyzed by GPC, whereby the number average molecular weight of the compound (A) was 4,750, the number average molecular weight of the partial condensate (B) was 12,030, and the proportion of the partial condensate (B) to the total amount of the compound (A) and the partial condensate (B) was 42 mass %.

[Dry Coating]

A composition was prepared by mixing composition (2) and composition (3) at a mass ratio shown in Table 1. Using this composition, surface treatment of a substrate was carried out by a dry coating method, to obtain an article in each Ex. As the substrate, chemically tempered glass was used. With respect to the obtained article, the friction durability was evaluated. The results are shown in Table 1.

The dry coating was carried out by using a vacuum vapor deposition apparatus (manufactured by Showa Shinku Co., Ltd., SGC-22WA) (vacuum vapor deposition method). 35 mg of the composition was filled in a molybdenum boat in the vacuum vapor deposition apparatus, and inside of the vacuum vapor deposition apparatus was evacuated to at most $5 \times 10^{-3}$ Pa. By heating the boat having the composition placed therein, and letting the composition be deposited on the surface of the substrate, a vapor-deposited film was formed on the surface of the substrate. The substrate having the vapor-deposited film formed thereon, was left to stand overnight under conditions of a temperature of 25° C. and a humidity of 40%, to obtain an article having the vapor-deposited film on the surface of the substrate.

TABLE 1

|  |  | Ex. 1 | Ex. 2 | Ex. 3 | Ex. 4 | Ex. 5 | Ex. 6 | Ex. 7 |
|---|---|---|---|---|---|---|---|---|
| Blend (mass %) | Composition (2) | 100 | 93 | 68 | 43 | 30 | 18 | 0 |
|  | Composition (3) | 0 | 7 | 32 | 57 | 70 | 82 | 100 |

TABLE 1-continued

|  |  | Ex. 1 | Ex. 2 | Ex. 3 | Ex. 4 | Ex. 5 | Ex. 6 | Ex. 7 |
|---|---|---|---|---|---|---|---|---|
| Partial condensate (B)/ {compound (A) + partial condensate (B)} (mass %) | | 2 | 5 | 15 | 25 | 30 | 35 | 42 |
| Water contact angle (degree) | Initial contact angle | 113 | 114 | 113 | 114 | 113 | 113 | 113 |
| | Contact angle after friction | 95 | 103 | 104 | 108 | 107 | 105 | 99 |
| | Difference in contact angle | 18 | 11 | 9 | 6 | 6 | 8 | 14 |

It was confirmed that In Ex. 2 to 6 wherein the proportion of the partial condensate (B) to the total amount of the compound (A) and the partial condensate (B) was from 4 to 40 mass %, the difference in the contact angle was small, and thus it was possible to obtain high friction durability. In particular, the friction durability was high in Ex. 4 wherein the proportion of the partial condensate (B) was 25 mass % and in Ex. 5 wherein the proportion of the partial condensate (B) was 30 mass %.

On the other hand, in Ex. 1 wherein the proportion of the partial condensate (B) in the total amount of the compound (A) and the partial condensate (B) was less than 4 mass % and in Ex. 7 wherein the proportion of the partial condensate (B) exceeded 40 mass %, the friction durability was insufficient.

Preparation of Composition (4)

Compound (10) was obtained in accordance with the method described in Example 6 in WO2013/121984.

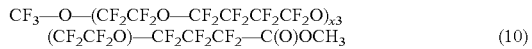
(10)

Compound (10): The average value of the number of units x3: 13, and the number average molecular weight: 4,700.

Into a 50 mL eggplant flask, 9.0 g of compound (10) and 0.45 g of $H_2N$—$CH_2$—$C(CH_2CH=CH_2)_3$ were put and stirred for 12 hours. From NMR, it was confirmed that compound (10) was all converted to compound (11). Further, methanol was produced as a by-product. The obtained solution was diluted with 9.0 g of $CF_3CH_2OCF_2CF_2H$ (manufactured by Asahi Glass Co., Ltd., AE-3000) and purified by silica gel column chromatography (developing solvent: AE-3000) to obtain 7.6 g (yield: 84%) of compound (11).

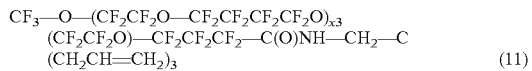
(11)

Compound (11): The average value for the number of units x3: 13, and the number average molecular weight: 4,800.

Into a 10 mL sample tube made of PFA, 6.0 g of compound (11), 0.07 g of a xylene solution (platinum content: 2%) of a platinum/1,3-divinyl-1,1,3,3-tetramethyl-disiloxane complex, 0.78 g of $HSi(OCH_3)_3$, $_{0.02}$ g of dimethyl sulfoxide, and 0.49 g of 1,3-bis(trifluoromethyl) benzene (manufactured by Tokyo Kasei Kogyo Co., Ltd.) were put and stirred at 40° C. for 10 hours. After completion of the reaction, the solvent, etc. were distilled off under reduced pressure, followed by filtration through a membrane filter having a pore size of 1.0 μm, to obtain 6.7 g (yield: 100%) of compound (12).

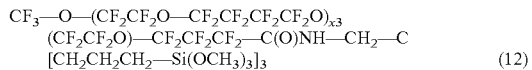
(12)

NMR spectrum of compound (12):
$^1$H-NMR (300.4 MHz, solvent: $CDCl_3$, reference: TMS) δ (ppm): 0.8 (6H), 1.3 to 1.6 (12H), 3.4 (2H), 3.7 (27H).
$^{19}$F-NMR (282.7 MHz, solvent: $CDCl_3$, reference: $CFCl_3$) δ (ppm): −55.2 (3F), −82.1 (54F), −88.1 (54F), −90.2 (2F), −119.4 (2F), −125.4 (52F), −126.2 (2F).

The average value for the number of units x3: 13, and the number average molecular weight of compound (12): 5,100.

Preparation of Composition (5)

Into a 20 mL screw tube, 8 g of HFE7200 (hydrofluoroether, trade name: Novec-7200, manufactured by 3M Co.) having the water content reduced to 10 ppm by dehydration treatment, and 2 g of composition (4) were put and stirred at room temperature for 1 hour to obtain composition (5).

Composition (5) was analyzed by GPC, whereby the number average molecular weight of the compound (A) was 4,730, the number average molecular weight of the condensate (B) was 9,930, and the proportion of the condensate (B) to the total amount of the compound (A) and the condensate (B) was 3 mass %.

Preparation of the Composition (6)

Into a 0.5 L autoclave made of SUS, 200 g of HFE7200 and 10 g of distilled water were put, heated to 80° C. and stirred for 3 hours. Then, moisture insoluble in HFE7200 was removed, followed by measurement by the Karl Fischer method, whereby the amount of water dissolved in HFE7200 was 85 ppm.

Into a 0.5 L autoclave made of SUS, 16 g of the above HFE7200 having water dissolved therein, 4 g of composition (4), and 0.1 mg of diethylamine, were put and stirred at 60° C. for 24 hours, to obtain composition (6).

Composition (6) was analyzed by GPC, whereby the number average molecular weight of the compound (A) was 4,680, the number average molecular weight of the partial condensate (B) was 13,490, the proportion of the partial condensate (B) to the total amount of the compound (A) and the partial condensate (B) was 57 mass %.

[Dry Coating]

A composition was prepared by mixing composition (5) and composition (6) at a mass ratio shown in Table 2. Using this composition, dry coating was carried out under the same conditions as the above-mentioned vacuum vapor deposition method by means of the vacuum vapor deposition apparatus (manufactured by Showa Shinku Co., Ltd., SGC-22WA), and surface treatment of a substrate was carried out, to obtain an article of each Ex. As the substrate, chemically tempered glass was used. With respect to the obtained article, the friction durability was evaluated. The results are shown in Table 2.

TABLE 2

| | | Ex. 8 | Ex. 9 | Ex. 10 | Ex. 11 |
|---|---|---|---|---|---|
| Blend (mass %) | Composition (5) | 100 | 80 | 50 | 0 |
| | Composition (6) | 0 | 20 | 50 | 100 |
| | Partial condensate (B)/{compound (A) + partial condensate (B)} (mass %) | 3 | 13.8 | 30 | 57 |
| Water contact angle (degree) | Initial contact angle | 113 | 114 | 113 | 114 |
| | Contact angle after friction | 103 | 110 | 109 | 102 |
| | Difference in contact angle | 10 | 4 | 4 | 12 |

It was confirmed that in Ex. 9 and 10 wherein the proportion of the partial condensate (B) to the total amount of the compound (A) and the partial condensate (B) was from 4 to 40 mass %, the difference in the contact angle was small, and thus it was possible to obtain high friction durability.

On the other hand, in Ex. 8 wherein the proportion of the partial condensate (B) in the total amount of the compound (A) and the partial condensate (B) was less than 4 mass % and in Ex. 11 wherein the proportion of the partial condensate (B) exceeded 40 mass %, the friction durability was insufficient.

INDUSTRIAL APPLICABILITY

The present composition can be used for various applications in which it is desired to impart water/oil repellency. For example, it can be used for surface protective coating of a display input device such as a touch panel, or a member made of a transparent glass or transparent plastic (acrylic, polycarbonate, etc.), kitchen antifouling coating, water repellent moisture-proof coating or antifouling coating of electronic devices, heat exchangers, batteries, etc., toiletry antifouling coating, coating of a member which is required to drain a liquid while conducting electricity, water repellent/waterproof/water slip coating of heat exchangers, surface low friction coating of e.g. a vibrating screen or cylinder interior, etc.

As a more specific use example, a front protective plate, reflection preventing plate or polarizing plate for a display, or one having anti-glare film treatment applied to its surface, various devices having a display input device to carry out an operation on a screen by a finger or palm of a person, such as a touch panel sheet or touch panel display of a device such as a cellular phone or mobile information terminal, decorative building materials around water, such as toilet, bath, washing room, kitchen, etc., waterproof coating of a wiring board, water repellent/waterproof coating for a heat exchanger, water repellent coating of a solar battery, waterproof/water repellent coating of a printed wiring board, waterproof/water repellent coating for electronic apparatus housing or electronic components, insulation improving coating of transmission lines, waterproof/water repellent coating of various filters, waterproof coating of radio wave absorbing materials or sound-absorbing materials, antifouling coating for bath, kitchen equipment or toiletries, water repellent/waterproof/water slip coating of a heat exchanger, surface low friction coating of a vibrating screen or cylinder interior, surface protection coating for e.g. mechanical parts, vacuum equipment parts, bearing parts, automobile parts, tools, etc. may be mentioned.

This application is a continuation of PCT Application No. PCT/JP2018/020580, filed on May 29, 2018, which is based upon and claims the benefit of priority from Japanese Patent Application No. 2017-110141 filed on Jun. 2, 2017. The contents of those applications are incorporated herein by reference in their entireties.

What is claimed is:

1. A fluorinated ether composition comprising a compound (A) having a poly(oxyperfluoroalkylene) chain and b groups (where b is an integer of 1 or more) each represented by the following formula (I), and a partial condensate (B) of the compound (A), characterized in that the proportion of the partial condensate (B) to the total amount of the compound (A) and the partial condensate (B) is from 4 to 40 mass %,

$$-SiR_nL_{3-n} \quad (I)$$

where L is a hydroxy group or a hydrolyzable group,
R is a hydrogen atom or a monovalent hydrocarbon group,
when b is an integer of at least 2, n is an integer of from 0 to 2, and when b is 1, n is 0 or 1,
when n is 0 or 1, (3-n) L may be the same or different,
when n is 2, n R may be the same or different,
wherein the number average molecular weight of the compound (A) is from 2,000 to 10,000, and
wherein the number average molecular weight of the partial condensate (B) is from 4,000 to 30,000.

2. The composition according to claim 1, wherein the number average molecular weight of the compound (A) is from 2,500 to 8,000.

3. The composition according to claim 1, wherein the number average molecular weight of the partial condensate (B) is from 5,000 to 25,000.

4. The composition according to claim 1, wherein the partial condensate (B) is a partially hydrolyzed condensate of the compound (A) wherein L is a hydrolyzable group.

5. The composition according to claim 1, wherein the compound (A) is a compound represented by the following formula (A1),

$$[R^{f1}-O-Q-R^{f\alpha}-]_a Z^1 [-SiR_nL_{3-n}]_b \quad (A1)$$

where L, R, n and b have the same meanings as defined above,
$R^{f1}$ is a perfluoroalkyl group,
Q is a single bond, an oxyfluoroalkylene group containing at least one hydrogen atom, or a polyoxyfluoroalkylene group having from 2 to 5 such oxyfluoroalkylene groups combined, wherein the oxyfluoroalkylene groups constituting such a group may be the same or different,
$R^{f\alpha}$ is said poly(oxyperfluoroalkylene) chain,
$Z^1$ is an (a+b)-valent linking group,
a is an integer of at least 1,
when a is at least 2, a $[R^{f1}-O-Q-R^{f\alpha}-]$ may be the same or different,
when b is at least 2, b $[-SiR_nL_{3-n}]$ may be the same or different.

6. The composition according to claim 1, wherein b is 2 or 3.

7. A coating liquid characterized by comprising the composition as defined in claim 1 and a liquid medium.

8. An article with vapor-deposited film, characterized by having a vapor-deposited film formed from the composition as defined in claim 1.

9. A method for producing an article with vapor-deposited film, characterized by vapor-depositing the composition as defined in claim 1 on a substrate.

10. The production method according to claim 9, wherein the vapor deposition is carried out under such conditions that the temperature is from 20 to 300° C. and the pressure is at most $1\times10^{-1}$ Pa.

* * * * *